(12) United States Patent
Poullet

(10) Patent No.: US 6,552,585 B2
(45) Date of Patent: Apr. 22, 2003

(54) FRACTIONAL FREQUENCY DIVISION OF A DIGITAL SIGNAL

(75) Inventor: Frédéric Poullet, Vizille (FR)

(73) Assignee: Dolphin Integration, Meylan (FR)

( * ) Notice: Subject to any disclaimer, the term of this patent is extended or adjusted under 35 U.S.C. 154(b) by 0 days.

(21) Appl. No.: 10/062,822

(22) Filed: Jan. 31, 2002

(65) Prior Publication Data

US 2002/0101955 A1 Aug. 1, 2002

(30) Foreign Application Priority Data

Jan. 31, 2001 (FR) .............................. 01 01335

(51) Int. Cl.[7] .............................................. H03K 21/00
(52) U.S. Cl. ...................................... 327/115; 327/117
(58) Field of Search ............................... 327/115, 113, 327/117, 231, 233; 377/43, 47, 48; 708/101, 103; 331/104

(56) References Cited

U.S. PATENT DOCUMENTS

| | | | |
|---|---|---|---|
| 4,573,176 A | * 2/1986 | Yeager | 331/1 A |
| 5,189,685 A | 2/1993 | Jaffard et al. | 377/48 |
| 5,970,110 A | * 10/1999 | Li | 327/115 |
| 6,127,863 A | * 10/2000 | Elliott | 327/115 |
| 6,310,498 B1 | * 10/2001 | Larsson | 327/141 |

FOREIGN PATENT DOCUMENTS

WO   WO 90/06017   5/1990

* cited by examiner

Primary Examiner—Timothy P. Callahan
Assistant Examiner—Linh Nguyen
(74) Attorney, Agent, or Firm—Duane Morris, LLP

(57) ABSTRACT

A method of fractional division of a frequency of a digital signal from N replicas of said digital signal shifted in phase with respect to one another by $2\pi/N$. This method consists of selecting a first replica to generate the rising edge and a second replica to generate the falling edge, the first and second replicas of a period of the resulting signal being different from the first and second replicas used in the next period.

20 Claims, 3 Drawing Sheets

FRACTIONAL FREQUENCY DIVISION OF A DIGITAL SIGNAL

This application claims priority rights under 35 U.S.C. §119 from French application No. 01/01335, filed on Jan. 31, 2001, the entire disclosure of which is hereby incorporated by reference.

BACKGROUND OF THE INVENTION

1. Field of the Invention

The present invention relates to the field of digital signal frequency dividers. The present invention more specifically relates to the forming of a fractional divider in a circuit from which several signals of same frequency shifted in phase with respect to one another can be extracted.

2. Discussion of the Related Art

The present invention is usable in phase-locked loops (PLL) which use a digital frequency divider in the regulation loop.

FIG. 1 very schematically shows in the form of blocks a conventional example of a phase-locked loop. Such a circuit is based on the use of a voltage-controlled oscillator (VCO) 1, the output of which provides a signal OUT representing the phase-regulated signal. As an input, the PLL receives a signal IN on which the output signal must be regulated. The signal IN is sent to a phase comparator 2 ($\Delta\psi$) providing an error signal to a low-pass filter 3 (LPF), the output of which controls the VCO 1. A second input of comparator 2 receives a feedback signal corresponding to signal OUT having crossed a frequency divider 4. In the application of the present invention, divider 4 is a fractional divider.

Conventionally, to obtain a fractional divider, the frequency of the digital signal is divided by two different non-zero integers P and Q. The divisions by P and Q are alternately performed, as appropriate; an average division between these two values is thus obtained. The resulting signal thus actually corresponds to the input digital signal, the frequency of which is divided by a fractional number comprised between P and Q.

A disadvantage of conventional fractional dividers is that the resulting signal exhibits a phase error which is all the greater as values P and Q are distant from each other. Now, since P and Q are integers, the minimum interval between these two values is 1. Basically, the phase error or jitter of the resulting signal is proportional to the period of the input signal multiplied by the difference between values P and Q.

SUMMARY OF THE INVENTION

The present invention aims at overcoming the disadvantages of known fractional dividers in terms of phase error of the resulting signal. In other words, the present invention aims at improving the resolution of fractional dividers.

The present invention more specifically aims at providing a fractional frequency divider of a digital signal having a resolution step of 1/N, where N is a natural non-zero integer.

The present invention also aims at providing a programmable fractional divider.

To achieve these objects, the present invention provides a method of fractional division of a frequency of a digital signal based on N replicas of said digital signal shifted in phase with respect to one another by $2\pi/N$. This method consists of selecting a first replica to generate the rising edge and a second replica to generate the falling edge, the first and second replicas of one period of the resulting signal being different from the first and second replicas used in the next period.

According to an embodiment of the present invention, the second replica of a current cycle forms the first replica of the next cycle.

According to an embodiment of the present invention, the replicas are chosen so that the edge of the second replica, which is useful in a current cycle, appears subsequently to the edge of same type of the first replica of the current cycle.

According to an embodiment of the present invention, to obtain a division ratio of (1+K/N), where K represents an integer, the sequence number AD2 of the second replica of a current cycle is obtained as a function of the sequence number AD1 of the first replica, by the following formula:

$AD2 = (AD1+K) \text{ modulo } N.$

The present invention also provides a fractional divider of a digital signal, including means for implementing the above-mentioned method.

According to an embodiment of the present invention, the fractional divider includes means for selecting, for each cycle of the resulting signal, a phase of a voltage-controlled oscillator providing the digital signal for one of the cycle edges and a different phase for the opposite edge.

According to an embodiment of the present invention, the resulting signal is provided by an output flip-flop having an output looped by an inverter on its input, a clock input of the output flip-flop being connected, through an inverter, to the output of a first multiplexer and a set input of the output flip-flop being connected to the output of a second multiplexer, the first and second multiplexers receiving the N phases of the signal to be divided.

According to an embodiment of the present invention, the multiplexer is controlled by a signal provided by an addressing flip-flop, said addressing flip-flops being assembled in series and a first addressing flip-flop receiving an address signal for selecting the phase of the current signal.

According to an embodiment of the present invention, the clock input of the first addressing flip-flop is connected to the output of the second multiplexer, the clock input of the second flip-flop being connected to the output of the inverter associated with the first multiplexer.

According to an embodiment of the present invention, the fractional divider includes a circuit for generating, for each cycle of the resulting signal, an address signal of selection of a phase of the digital signal based on an integral number of programming operations ranging between 0 and N−1.

The foregoing objects, features and advantages of the present invention will be discussed in detail in the following non-limiting description of specific embodiments in connection with the accompanying drawings.

DETAILED DESCRIPTION

Figure 1:
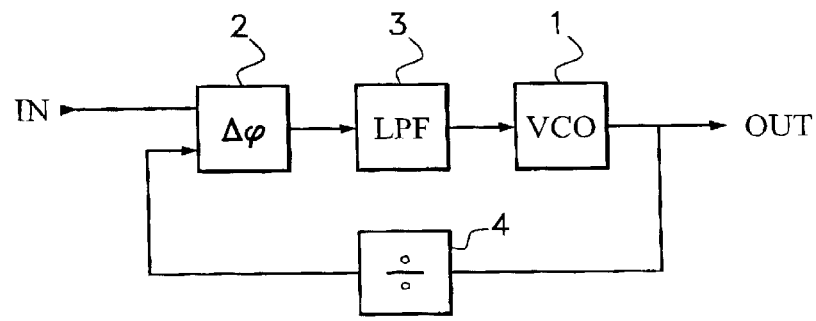
FIG. 1, previously described, shows a conventional phase-locked loop.

Same elements have been designated with the same references in the different drawings. For clarity, only those elements which are useful to the understanding of the present invention have been shown in the drawings and will be described hereafter. In particular, the upstream and downstream circuits of a fractional divider have not been detailed and are no object of the present invention. Especially, the obtaining of the replicas of the signal to be divided, used in the present invention, is within the abilities of those skilled in the art, for example, using the different inverter outputs of a conventional ring oscillator, or any other means.

A feature of the present invention is to select, from among the replicas of different phases of a digital signal, the frequency of which is desired to be divided, one of the phases for the rising edge and another phase for the falling edge of each cycle of the resulting signal, while ascertaining that the two phases are different from each other. Thus, according to the present invention, it is provided, not only to have the rising and falling edges of each cycle of the divided signal come from two different phases of the original digital signal, but also to have the sequence number of the used phases change for each cycle or period of the resulting signal. For a given division ratio, the same phases are of course cyclically reused to keep a constant frequency.

An advantage of changing phases, cyclically, for each period, is that the phase error is suppressed with a resolution corresponding to the period of the original signal divided by the number of phases.

The selection of the used phases of the digital signal to be divided of course depends on the number of available phases, that is, on the number of different available phase replicas and on the desired division ratio.

Another feature of the present invention is that the phase used for the second edge of a current cycle is the same as that used for the first edge of the next cycle. An advantage then is that, even if two different phases are necessary for each cycle, a single programming per cycle of the resulting digital signal is enough.

Assuming that N phases of a same digital signal to be divided, shifted in phase with respect to one another by $2\pi/N$, are used, and considering that the N phases are arranged and numbered from 1 to N, rank AD2 (between 1 and N) of the phase of the second edge of a cycle is, preferably, provided by the following relation:

$$AD2=(AD1+K) \text{ modulo } N,$$

where AD1 represents the rank of the phase of the first edge of the current cycle (and thus of the phase of the second edge of the preceding cycle), and where K is an integer setting the desired division ratio corresponding to 1+K/N.

Since the number N of available phases in a fractional divider of the present invention is set by design, the selection of the phase of each cycle requires knowing the variable K which sets the value of the fractional division ratio 1+K/N. Also the signal resulting from the division must be synchronized.

Figure 2:
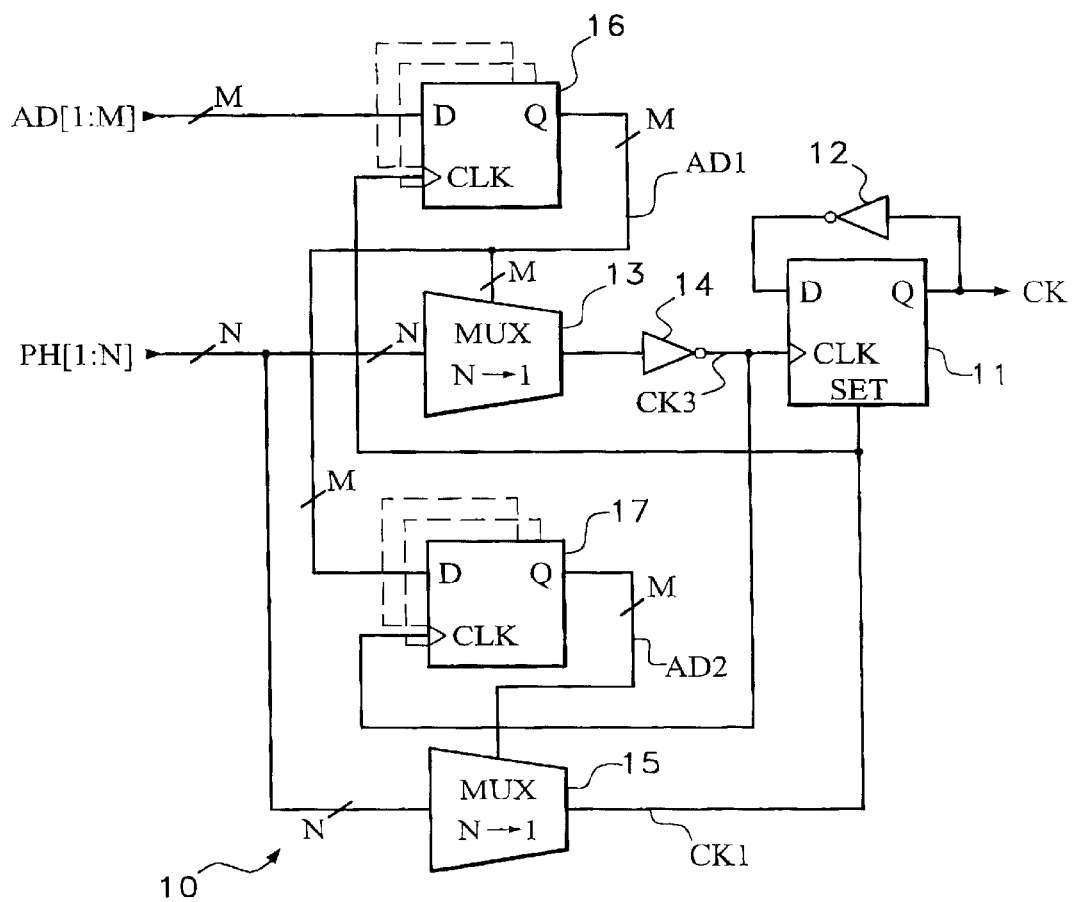
FIG. 2 shows an embodiment of a fractional divider according to the present invention.

FIG. 2 shows an embodiment of a programmable fractional divider 10 according to the present invention. FIG. 2 shows the portion executing the actual division. In other words, circuit 10 of FIG. 2 receives as an input the N phases or replicas PH[1:N] of the digital signal to be divided as well as, for each cycle, the address AD[1:M] or rank over M bits of the wanted phase at the second edge. Circuit 10 provides signal CK corresponding to a clock signal having a frequency equal to the frequency of the digital input signal divided by 1+K/N.

In the example of FIG. 2, circuit 10 includes an output flip-flop 11, the Q output of which provides signal CK and which is controlled from the phases of the digital signal to be divided. Output Q of flip-flop 11 is looped on its data input D by means of an inverter 12. Clock input CLK of flip-flop 11 receives a signal CK3 corresponding to the output of a first multiplexer 13, inverted by an inverter 14. The set input of flip-flop 11 receives a signal CK1 corresponding to the output of a second multiplexer 15. Multiplexers 13 and 15 are multiplexers N to 1 receiving the N phases PH[1:N] of the signal to be divided on respective inputs.

The selection of one of the phases by multiplexers 13 is 15 is performed from address signal AD[1:M] identifying the phase sequence number. The number of bits of signal AD depends on the possible coding performed and on the multiplexer characteristics. The simplest is for number M of bits to correspond to number N of phases, each bit of signal AD representing a phase. If the selection of a phase requires a high state, a single one of the bits of signal AD is high at a given time. In this embodiment, the selection input of first multiplexer 13 is connected to the (for example, direct) Q output (signal AD1) of an addressing flip-flop 16 having its data input D receiving signal AD. Since this signal is over several bits, several flip-flops 16 similarly connected are used in practice to properly address multiplexer 13. This use of several flip-flops has been symbolized by dotted lines in FIG. 2. For each bit of signal AD, the selection input of second multiplexer 15 is connected to the output of the corresponding flip-flop 16 via a second addressing flip-flop 17. The Q outputs of flip-flops 17 (signal AD2) are connected to the address inputs of multiplexer 15 while their data inputs are connected to the Q outputs of flip-flops 16. The function of flip-flops 16 and 17 is to successively transfer a same address from one multiplexer to the other, the first edge of the current cycle using the same phase as the second edge of the preceding cycle.

The synchronization of circuit 10 is performed as follows. Clock input CLK of flip-flop 16 is connected to the output of multiplexer 15 (terminal SET of flip-flop 11). Clock input CLK of flip-flop 17 is connected to the output of inverter 14 (clock input of flip-flop 11). In the example of FIG. 2, the respective reset inputs of flip-flops 16 and 17 are not connected. This causes a starting of the system in a random position. As an alternative, these reset inputs may be connected to a specific signal to start in a determined state.

Phases PH[1:N] are applied in the same order to the respective inputs of multiplexers 13 and 15 to be able to use the same address signals. As an alternative, the order may be different provided to accordingly adapt the control signals of the multiplexers.

Figure 3:
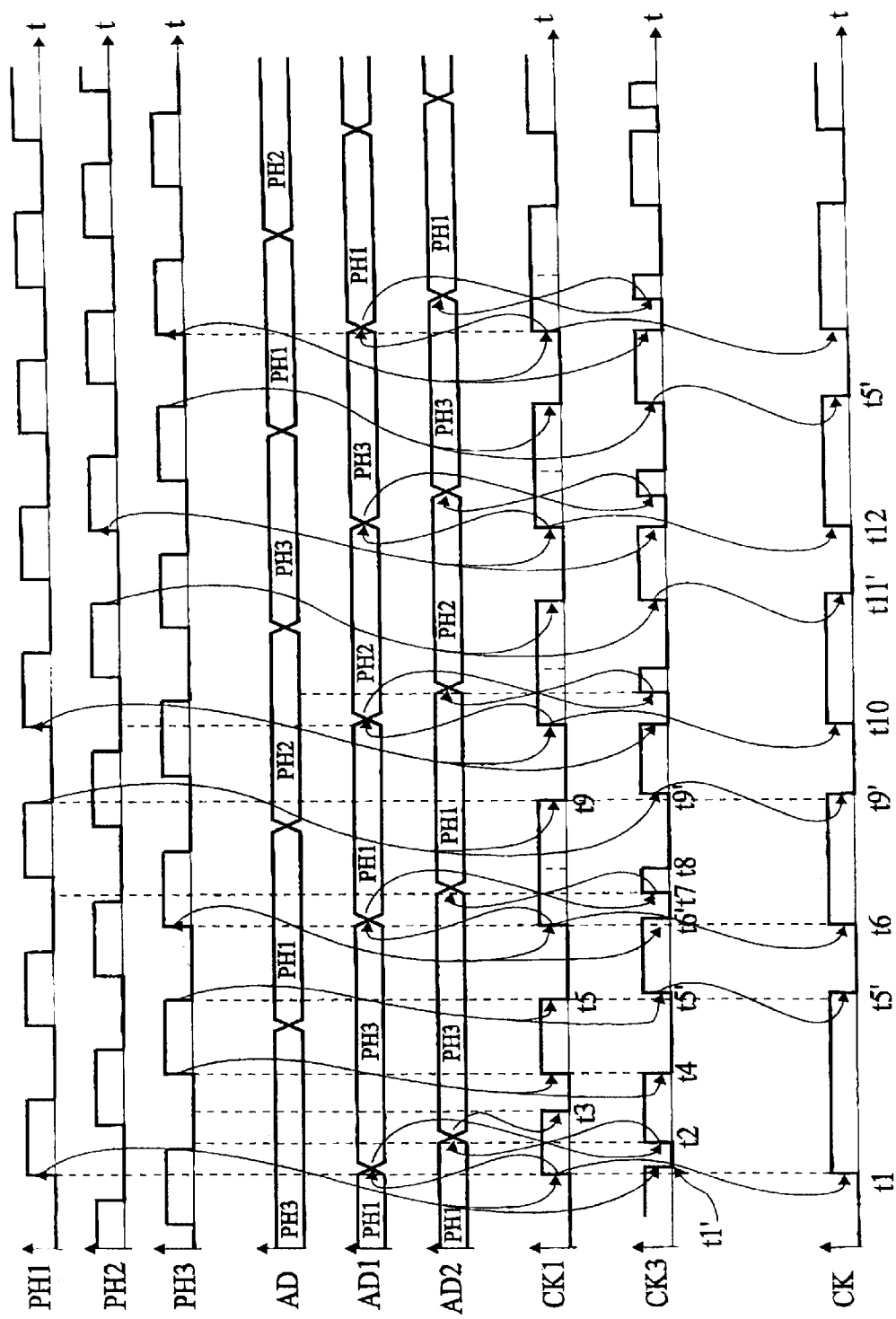
FIG. 3 illustrates in the form of timing diagrams the operation of the fractional divider of FIG. 2.

The operation of circuit 10 of FIG. 2 will be discussed hereafter in relation with FIG. 3, which illustrates, in the form of timing diagrams, an example of shapes of characteristic signals. In the example of FIG. 3, an operation by means of three phases PH1, PH2, and PH3 of a signal of fixed frequency to be divided is assumed. FIG. 3 shows an example of these three phases as well as an example of shapes of signals AD, AD1, AD2, CK1, CK3, and CK for a fractional division of the frequency by four thirds. By applying the relation previously indicated for the selection of the successive phases, number K is equal to 1 (4/3=1+1/3). The different phases PH1, PH2, PH3 must thus be selected sequentively. Accordingly, address signal AD successively conveys the selection code of successive phases PH1, PH2, and PH3.

Taking the example of FIG. 2 where flip-flops 16 and 17 are not set on a specific signal, it is arbitrarily assumed that signals AD1 and AD2 are in a state representing the code of phase PH1. Accordingly, multiplexers 13 and 15 provide signal PH1 on their respective outputs.

At a time t1 corresponding to the occurrence of a rising edge on phase PH1, signal CK1 switches to state 1, which forces the Q output of flip-flop 11 to state 1 (signal CK). Further, the rising edge of signal CK1 causes the reading of the signal present at the input of flip-flop 16. Accordingly, signal AD1 takes value PH3 from this time t1. Multiplexer 13 thus selects phase PH3 (in the high state), and its output switches high together with the output of multiplexer 15. However, due to the presence of an inverter 14, signal CK3 switches low at a slightly subsequent time t'1. At a time t2, slightly subsequent to the falling edge of phase PH3, signal CK3 switches high. Flip-flop 17 then transfers the address of phase PH3 (signal AD1) onto signal AD2. When this selection is effective (time t3), signal CKI takes the state of phase PH3 and thus switches low. Input D of output flip-flop 11 is then low. However, since at time t2, input SET still was high, this has caused no state switching of signal CK. At the end of the current cycle of phase 3 (time t4), the rising edge of signal TH3 is reproduced on signals CK1 and CK3 (with a slight delay for signal CK3). At a time t5, corresponding to the next falling edge of phase PH3, signal CK1 switches to the low state, thus placing flip-flop 11 in a state controllable by its clock input. As a result, when, at a time t5' delayed by inverter 14, signal CK3 switches to 1, flip-flop 11 reads the datum present on its input. Accordingly, signal CK exhibits a falling edge. The slight delay introduced by inverter 14 guarantees that signal CK1 has fallen back before occurrence of the rising edge of signal CK3.

Signal PH3 will condition the rising edge of the next cycle of signal CK. Accordingly, at a time t6 corresponding to the rising edge of phase PH3, signal CK switches to state 1 at the same time as address signal AD1 takes the value of the next phase PH1. Signal CK3 falls back at a slightly subsequent time t6'. At a time t7 when signal CK3 exhibits a rising edge by the taking into account of the state of phase PH1, the address of phase 1 is transferred onto signal AD2 by flip-flop 17. Signal CK3 falls back at a time t8 where phase PH1 exhibits the next rising edge. In this example, signal CK1 remains high since phases PH3 and PH1 have successively overlapping high states. At the next falling edge (time t9) of phase PH1, signal CK1 switches to the low state, freeing flip-flop 11. As a result, when the falling edge of signal PH1 translates on signal CK3 by a rising edge (time t'9), signal CK switches low.

Phase PH1 is used for the rising edge of the next cycle (time t10). The operation continues. Phase PH2 is used for the falling edge of the ongoing cycle (time t11'). Phase PH2 is used for the rising edge of next cycle t12. The next falling edge is again conditioned by phase PH3 (time t5').

According to the initial state of signals AD1 and AD2, the first cycle of signal CK may be inexact. Such is the case in the representation of FIG. 3. However, since the second cycle, the signal is obtained with the desired fractional ratio. In the phase selection to implement the present invention by means of the circuit of FIG. 2, it will be ascertained that the falling edge of the phase used for the falling edge of a cycle occurs subsequently to the falling edge of the phase used for the rising edge of this cycle.

An advantage of the present invention is that it enables division by a fractional ratio by minimizing the phase interval of the obtained signal CK. It should be noted that if the address of the used phase is not modified, signal CK reproduces the corresponding phase. In this case, variable K is 0.

The period of output signal CK of a fractional divider according to the present invention ranges between T and $[1+(N-1)/N]*T$, where T represents the period of the digital signal to be divided (phases PH1, PH2, PH3). A fractional divider enabling performing frequency divisions with a 1/N step is thus obtained. Further, the programming of the fractional divider may be modified, if necessary, for each cycle of the resulting signal.

Different methods may be used to set programming signal AD of circuit 10. What matters is to respect the previously-indicated phase selection rule.

Figure 4:
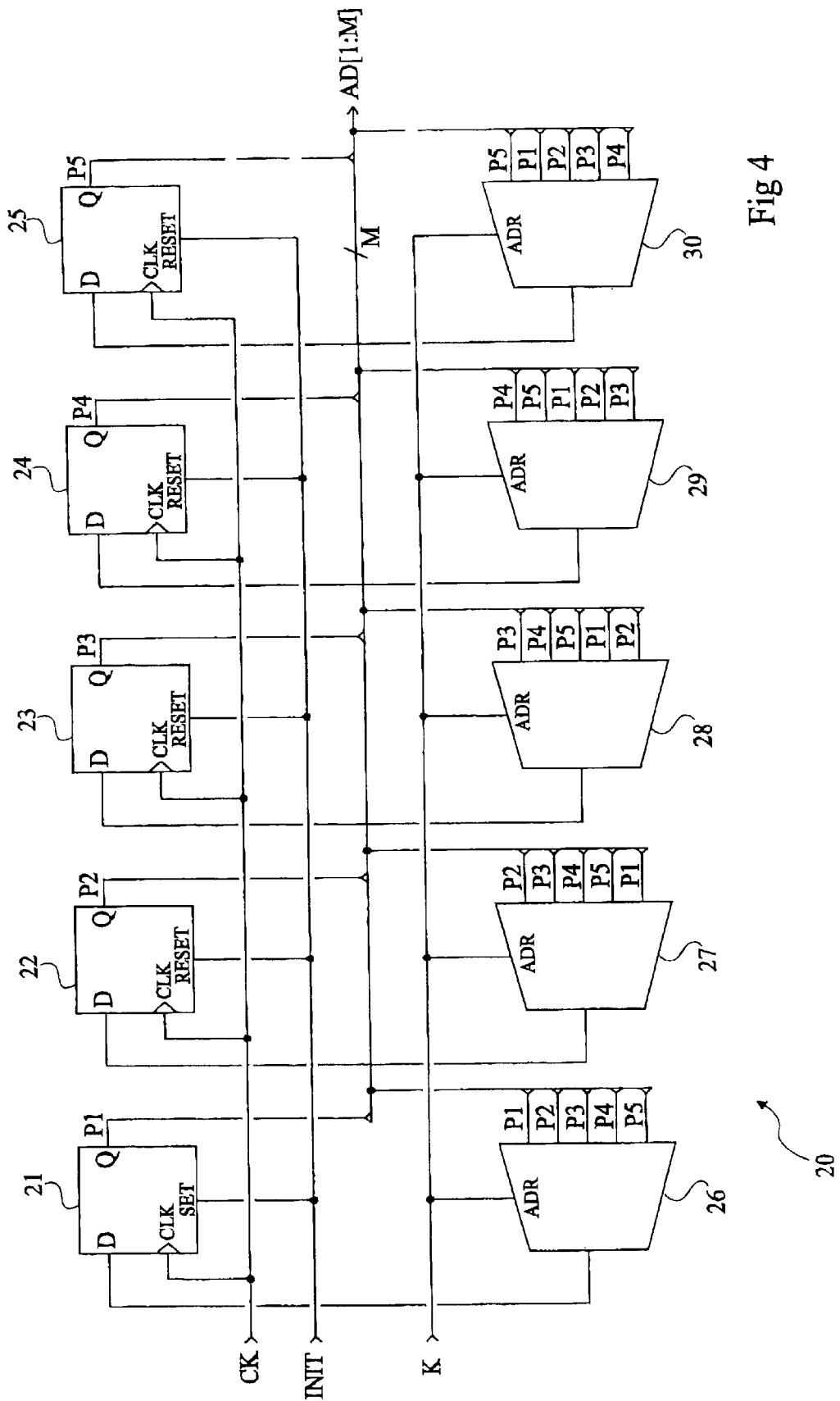
FIG. 4 shows an embodiment of a phase selection circuit according to the present invention.

FIG. 4 shows an exemplary embodiment of a phase selection circuit 20 of a fractional divider according to the present invention. Circuit 20 is intended to be associated with a circuit 10 such as illustrated in FIG. 2. Selection circuit 20 receives clock signal CK, reference K setting the division ratio, and an initialization signal INIT. Circuit 20 provides signal AD over M bits.

In the example of FIG. 4, a fractional divider exploiting five phases of the input digital signal and a signal AD including one bit per phase (M=N) are considered.

Circuit 20 is based on the use of flip-flops and multiplexers. It is comprised of as many flip-flops and multiplexers as there are phases to be processed. Accordingly, five flip-flops 21, 22, 23, 24, and 25 have been shown in FIG. 4. All these flip-flops receive on their respective clock inputs CLK signal CK provided by circuit 10 (FIG. 2). A first flip-flop 21 has a set input while the other flip-flops 22 to 25 have a reset input. The set and reset inputs of flip-flops 21 to 25 receive signal INIT enabling starting the system. Circuit 20 further includes five multiplexers 26, 27, 28, 29, and 30, each having a number of inputs corresponding to the number of phases of the digital signal to be divided (in this example, 5). Each multiplexer provides an output signal to one of flip-flops 21 to 25. The output of multiplexer 26 is connected to data input D of flip-flop 21. The output of multiplexer 27 is connected to the D input of flip-flop 22, and so on until multiplexer 30, the output of which is connected to the D data input of flip-flop 25. The respective direct (Q) outputs of flip-flops 21 to 25 form signal AD[1:M] for circuit 10. In the example shown in FIG. 4, flip-flop 21 provides a bit P1 for addressing phase PH1. Flip-flop 22 provides a bit P2 for addressing phase PH2, and so on until flip-flop 25, which provides a bit P5 of addressing of phase PH5. Each bit P1 to P5 is, for example, active in the high state to select the corresponding phase. A single bit P1 to P5 must be high at a given time so that signal AD includes four bits at state zero and one bit at state 1 according to the selected phase.

Each multiplexer 26 to 30 receives the N respective output signals of flip-flops 21 to 25, successively shifted in the order of the multiplexer inputs. Multiplexer 26 receives bits P1 to P5 in their numerical order. Multiplexer 22 respectively receives on its different inputs bits P2, P3, P4, P5, and P1. Multiplexer 28 receives on its five inputs, respectively, bits P3, P4, P5, P1, and P2. Multiplexer 29 receives on its five inputs, respectively, bits P4, P5, P1, P2, and P3. Finally, multiplexer 30 receives, in the order, bits P5, P1, P2, P3, and P4. The order in which the bits are assigned to the different inputs of the multiplexers aims at organizing, by means of a single configuration signal K linked to the respective selection inputs ADR of multiplexers 26 to 30, the succession of the different phases at the input of circuit 10 of FIG. 2.

Initially, initialization signal INIT is placed at state 1, which forces the output of flip-flop 21 to the high state while the respective outputs of flip-flops 22 to 25 (generally speaking, to N) are forced to the low state. Accordingly, only bit P1 is at state 1.

The selection of number K between 0 and N−1 enables programming the fractional divider according to the previously described relation (1+K/N). As long as the division ratio remains the same, number K remains unchanged. At each cycle CK of the resulting signal provided by circuit 10 of FIG. 2, the phase order is shifted according to the number K of programming operations. Assuming that a division by ⅗ths is desired, number K must be equal to 3 (⅗=1+⅗). The phase sequence to be cyclically obtained thus is 1, 4, 2, 5, and 3. In the example of FIG. 4, a number K equal to 3 means that the different multiplexers 26 to 30 select their third respective inputs. The signal AD of a current cycle of signal CK thus corresponds to sequence P3, P4, P5, P1, P2 of the bits of the signal AD of the preceding cycle. Initially, signal AD exhibits sequence 00010 (P3, P4, P5, P1, P2). The only flip-flop having its data input at state 1 is flip-flop 24. At the next clock cycle, signal P4 accordingly switches to state 1. Signal AD then becomes 01000 (P3, P4, P5, P1, P2). Flip-flop 22 then has its data input at state 1. At the next cycle, bit P2 switches to state 1 (bit selected by multiplexer 30). Sequence AD thus is 00001. At the next cycle, bit P5 corresponding to the third input of multiplexer 28 will provide code 00100. Finally, at the fifth cycle, bit P3 switches to state 1 and multiplexer 26 provides a high state on its output. The address is 10000. This brings back to the situation of a setting to the high state of bit P1.

The address signal AD each time represents the data inputs of flip-flops 16 (FIG. 2), and thus the input of multiplexer 13, then 15, to be selected. The phase sequence indicated hereabove is thus obtained.

An advantage of the embodiment of FIG. 4 is that it is particularly simple to implement.

Of course, the present invention is likely to have various alterations, modifications, and improvements which will readily occur to those skilled in the art. In particular, the number of flip-flops and of multiplexers of the phase selection system is to be adapted to the number of phases applied to the digital signal to be divided. Further, the flip-flops and multi-plexers may be replaced with other equivalent means, be it in portion 10 or in portion 20 of the system. Further, other implementation means may be selected, provided to respect the described functionalities. For example, address signal AD may be provided to divider 10 from a software programming of a microprocessor instead of being provided by circuit 20 or by an equivalent wired logic circuit. Similarly, variable K of circuit 20 may be provided by any means (switches, microprocessor, logic circuit, etc.) . The choice is made, for example, according to the envisaged programming frequency (of modification of the division ratio).

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of fractional division of a frequency of a digital signal from N replicas (PH1, PH2, PH3) of said digital signal shifted in phase with respect to one another by 2π/N, comprising selecting a first replica to generate the rising edge and a second replica to generate the falling edge, the first and second replicas of a period of the resulting signal (CK) being different from the first and second replicas used in the next period, wherein N>1.

2. The method of claim 1, wherein the second replica of a current cycle forms the first replica of the next cycle.

3. The method of claim 1, wherein the replicas are chosen so that the edge of the second replica, which is useful in a current cycle, appears subsequently to the edge of same type of the first replica of the current cycle.

4. The method of claim 1, wherein, to obtain a division ratio of (1+K/N), where K represents an integer, the sequence number (AD2) of the second replica of a current cycle is obtained, based on sequence number (AD1) of the first replica, by the following formula:

$$AD2 = (AD1 + K) \text{ modulo } N.$$

5. A fractional divider of a digital signal, comprising means for receiving the replicas and providing the resulting signal to implement the method of claim 1.

6. The fractional divider of claim 5, including means for selecting, for each cycle of the resulting signal, a phase (PH1, PH2, PH3) of a voltage-controlled oscillator providing the digital signal for one of the cycle edges and a different phase for the opposite edge.

7. The fractional divider of claim 6, wherein the resulting signal (CK) is provided by an output flip-flop (11) having an output (Q) looped by an inverter (12) on its input (D), a clock input (CLK) of the output flip-flop being connected, by an inverter (14), to the output of a first multiplexer (13) and a set input (SET) of the output flip-flop being connected to the output of a second multiplexer (15), the first and second multiplexers receiving, as an input, the N phases of the signal to be divided.

8. The fractional divider of claim 7, wherein each multiplexer (13, 15) is controlled by a signal (AD1, AD2) provided by an addressing flip-flop (16, 17), said addressing flip-flops being assembled in series and a first addressing flip-flop (16) receiving an address signal (AD) for selecting the phase of the current signal.

9. The fractional divider of claim 8, wherein the clock input (CLK) of the first addressing flip-flop (16) is connected to the output of the second multiplexer (15), the clock input (CLK) of the second flip-flop (17) being connected to the output of the inverter (14) associated with the first multiplexer (13).

10. The fractional divider of claim 6, including a circuit (20) for generating, for each cycle of the resulting signal, an address signal (AD) of selection of a phase of the digital signal based on an integral number (K) of programming operations ranging between 0 and N−1.

11. A fractional divider of a digital signal, comprising means for receiving the replicas and providing the resulting signal to implement the method of claim 2.

12. A fractional divider of a digital signal, comprising means for receiving the replicas and providing the resulting signal to implement the method of claim 3.

13. A fractional divider of a digital signal, comprising means for receiving the replicas and providing the resulting signal to implement the method of claim 4.

14. The fractional divider of claim 11, comprising means for selecting, for each cycle of the resulting signal, a phase (PH1, PH2, PH3) of a voltage-controlled oscillator providing the digital signal for one of the cycle edges and a different phase for the opposite edge.

15. The fractional divider of claim 12, comprising means for selecting, for each cycle of the resulting signal, a phase (PH1, PH2, PH3) of a voltage-controlled oscillator providing the digital signal for one of the cycle edges and a different phase for the opposite edge.

16. The fractional divider of claim 13, comprising means for selecting, for each cycle of the resulting signal, a phase (PH1, PH2, PH3) of a voltage-controlled oscillator providing the digital signal for one of the cycle edges and a different phase for the opposite edge.

17. The fractional divider of claim 14, wherein the resulting signal (CK) is provided by an output flip-flop (11) having an input (Q) looped by an inverter (12) on its input (D), a clock input (CLK) of the output flip-flop being connected, by an inverter (14), to the output of a first multiplexer (13) and a set input (SET) of the output flip-flop being connected to the output of a second multiplexer (15), the first and second multiplexers receiving, as an input, the N phases of the signal to be divided.

18. The fractional divider of claim 15, wherein the resulting signal (CK) is provided by an output flip-flop (11) having an input (Q) looped by an inverter (12) on its input (D), a clock input (CLK) of the output flip-flop being connected, by an inverter (14), to the output of a first multiplexer (13) and a set input (SET) of the output flip-flop being connected to the output of a second multiplexer (15), the first and second multiplexers receiving, as an input, the N phases of the signal to be divided.

19. The fractional divider of claim 16, wherein the resulting signal (CK) is provided by an output flip-flop (11) having an input (Q) looped by an inverter (12) on its input (D), a clock input (CLK) of the output flip-flop being connected, by an inverter (14), to the output of a first multiplexer (13) and a set input (SET) of the output flip-flop being connected to the output of a second multiplexer (15), the first and second multiplexers receiving, as an input, the N phases of the signal to be divided.

20. The fractional divider of claim 17, wherein each multiplexer (13,15) is controlled by a signal (AD1, AD2) provided by an addressing flip-flop (16, 17), said addressing flip-flops being assembled in series and a first addressing flip-flop (16) receiving an address signal (AD) for selecting the phase of the current signal.

* * * * *